United States Patent
Li et al.

(10) Patent No.: US 12,052,834 B2
(45) Date of Patent: Jul. 30, 2024

(54) ATTACHING DEVICE FOR FLEXIBLE DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Fei Li, Beijing (CN); Zhihao Xie, Beijing (CN); Yupeng Chen, Beijing (CN); Bowen Xiao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 758 days.

(21) Appl. No.: 17/212,245

(22) Filed: Mar. 25, 2021

(65) Prior Publication Data

US 2022/0071030 A1 Mar. 3, 2022

(30) Foreign Application Priority Data

Aug. 26, 2020 (CN) .......................... 202010872012.9

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .... H05K 5/0217; H05K 5/0017; G05D 23/19; G09F 9/301; H05B 3/06; H05B 2203/014; H05B 3/34
See application file for complete search history.

(56) References Cited

U.S. PATENT DOCUMENTS

| 10,285,289 B2 * | 5/2019 | Sun .......................... G09F 9/33 |
| 2014/0003006 A1 * | 1/2014 | Ahn ...................... G06F 1/1679 361/749 |

(Continued)

FOREIGN PATENT DOCUMENTS

| CN | 102683236 A | 9/2012 |
| CN | 204189830 U | 3/2015 |

(Continued)

OTHER PUBLICATIONS

Translation of CN 208169860 (Year: 2024).*

(Continued)

*Primary Examiner* — Sagar Shrestha
(74) *Attorney, Agent, or Firm* — XSENSUS LLP

(57) ABSTRACT

The present disclosure relates to the field of display technology, and proposes an attaching device for a flexible display panel, including a flexible adsorption plate, a first adjustment rod, and a second adjustment rod. The flexible adsorption plate is configured to be bendable and adsorb a flexible layer of the flexible display panel. The first end of the first adjustment rod is connected to the first end of the second adjustment rod, the second end of the first adjustment rod is connected to the first side of the flexible adsorption plate, and the second end of the second adjustment rod is connected to the second side opposite to the first side of the flexible adsorption plate. For at least one of the first and second adjustment rods, the second end is configured to be movable relative to the first end for adjusting the degree of bending of the flexible layer.

13 Claims, 2 Drawing Sheets

(56) References Cited

U.S. PATENT DOCUMENTS

| | | | | |
|---|---|---|---|---|
| 2015/0092353 | A1* | 4/2015 | Baik | H05K 1/028 |
| | | | | 361/720 |
| 2015/0145755 | A1* | 5/2015 | Yamazaki | G09G 3/03 |
| | | | | 361/679.01 |
| 2015/0223358 | A1* | 8/2015 | Nam | G06F 1/1652 |
| | | | | 74/102 |
| 2015/0316962 | A1* | 11/2015 | Howes | G09F 15/0031 |
| | | | | 16/87.2 |
| 2016/0035310 | A1* | 2/2016 | Song | G06F 3/017 |
| | | | | 345/156 |
| 2017/0168524 | A1* | 6/2017 | Kim | G06F 1/1626 |
| 2017/0374750 | A1 | 12/2017 | Sun | |
| 2018/0301643 | A1 | 10/2018 | Xu | |
| 2019/0259976 | A1* | 8/2019 | Kishimoto | G02F 1/133305 |
| 2020/0025325 | A1* | 1/2020 | Wu | F16M 11/22 |
| 2020/0192434 | A1* | 6/2020 | Huang | G06F 1/1681 |
| 2021/0026416 | A1* | 1/2021 | Magi | G06F 1/1601 |
| 2021/0141587 | A1* | 5/2021 | Cho | G02F 1/133305 |
| 2023/0072005 | A1* | 3/2023 | Oh | H05K 5/0226 |

FOREIGN PATENT DOCUMENTS

| | | |
|---|---|---|
| CN | 106597711 A | 4/2017 |
| CN | 108847139 A | 11/2018 |
| CN | 208169860 U | 11/2018 |
| CN | 208487385 U | 2/2019 |
| CN | 111223406 A | 6/2020 |

OTHER PUBLICATIONS

First Office Action for CN Patent Application No. 202010872012.9 mailed Sep. 29, 2021.

Office Action issued on Apr. 19, 2022, in corresponding Chinese patent Application No. 202010872012.9, 19 pages.

* cited by examiner

ATTACHING DEVICE FOR FLEXIBLE DISPLAY PANEL

CROSS-REFERENCE TO RELATED APPLICATION(S)

The present application claims the priority of the Chinese Patent Application No. 202010872012.9 filed on Aug. 26, 2020, the disclosure of which is incorporated herein by reference in its entirety for all purposes.

TECHNICAL FIELD

The present disclosure relates to the field of display technology and, in particular, to an attaching device for a flexible display panel.

BACKGROUND

The flexible display panel is generally formed by laminating and attaching flexible layers such as a flexible array substrate, a support layer, an optical adhesive layer, a base film, and a cover plate. However, when the flexible display panel is bent, adjacent flexible layers in the flexible display panel have different extending paths, leading to layer staggering therebetween. When a serious phenomenon of layer staggering happens, adjacent layers in the display panel will fall off.

In the related art, the curved surface attachment is generally used to reduce the falling off risk of layers. That is, the attachment is performed at the bent state of the above-mentioned flexible layers. However, when different display panels or different layers in the same display panel are attached, the curved surfaces for attachment need to be provided with different bending angles, resulting in higher attachment cost.

It should be noted that the information disclosed in the Background section above is only used to enhance understanding the background of the present disclosure, and therefore may include information that does not constitute the prior art known to those of ordinary skills in the art.

SUMMARY

According to an aspect of the present disclosure, there is provided an attaching device for a flexible display panel. The attaching device includes a flexible adsorption plate, a first adjustment rod, and a second adjustment rod. The flexible adsorption plate is configured to be bendable and to adsorb a flexible layer of the flexible display panel. The first end of the first adjustment rod is connected to the first end of the second adjustment rod, the second end of the first adjustment rod is connected to the first side of the flexible adsorption plate, and the second end of the second adjustment rod is connected to the second side of the flexible adsorption plate, wherein the second side is opposite to the first side. The second end of the first adjustment rod is configured to be movable relative to the first end of the first adjustment rod, and/or the second end of the second adjustment rod is configured to be movable relative to the first end of the second adjustment rod, for adjusting the degree of bending of the flexible layer.

In an exemplary embodiment of the present disclosure, the first end of the first adjustment rod is fixedly connected to the first end of the second adjustment rod, and at least one of the first adjustment rod and the second adjustment rod is configured to be retractable.

In an exemplary embodiment of the present disclosure, the attaching device further includes a first rigid support and a second rigid support. The first rigid support extends along an edge at the first side of the flexible adsorption plate, and is connected to the first side of the flexible adsorption plate at a plurality of positions in the extension direction of the flexible adsorption plate. The second rigid support extends along an edge at the second side of the flexible adsorption plate, and is connected to the second side of the flexible adsorption plate at a plurality of positions in the extension direction of the second rigid support. The second end of the first adjustment rod and the first rigid support are fixedly connected to each other. The second end of the second adjustment rod and the second rigid support are fixedly connected to each other.

In an exemplary embodiment of the present disclosure, the first adjustment rod includes a first telescopic cylinder and a second telescopic cylinder. The cylinder end of the first telescopic cylinder forms the first end of the first adjustment rod. The cylinder end of the second telescopic cylinder is connected to the piston end of the first telescopic cylinder, and the piston end of the second telescopic cylinder forms the second end of the first adjustment rod. The adjustment accuracy of the first telescopic cylinder is less than the adjustment accuracy of the second telescopic cylinder. Alternatively, the adjustment accuracy of the second telescopic cylinder is less than the adjustment accuracy of the first telescopic cylinder.

In an exemplary embodiment of the present disclosure, the second adjustment rod includes a third telescopic cylinder and a fourth telescopic cylinder. The cylinder end of the third telescopic cylinder forms the first end of the second adjustment rod. The cylinder end of the fourth telescopic cylinder is connected to the piston end of the third telescopic cylinder, and the piston end of the fourth telescopic cylinder forms the second end of the second adjustment rod. The adjustment accuracy of the third telescopic cylinder is less than the adjustment accuracy of the fourth telescopic cylinder. Alternatively, the adjustment accuracy of the fourth telescopic cylinder is less than the adjustment accuracy of the third telescopic cylinder.

In an exemplary embodiment of the present disclosure, the attaching device further includes a rotating component, and the rotating component includes a fixing member and a rotating shaft. The rotating shaft is rotatably connected to the fixing member along its axial direction. The first end of the first adjustment rod and the first end of the second adjustment rod are fixedly connected to the rotating shaft, and the axial direction of the rotating shaft is parallel to the flexible adsorption plate.

In an exemplary embodiment of the present disclosure, the first end of the first adjustment rod is rotatably connected to the first end of the second adjustment rod, and the second end of the first adjustment rod is configured to be rotatable about the first end of the first adjustment rod, and/or the second end of the second adjustment rod is configured to be rotatable about the first end of the second adjustment rod, for adjusting the angle between the first adjustment rod and the second adjustment rod.

In an exemplary embodiment of the present disclosure, the second end of at least one of the first adjustment rod and the second adjustment rod is slidably connected to the first side or the second side of the flexible adsorption plate.

In an exemplary embodiment of the present disclosure, the connection between the first end of the first adjustment rod and the first end of the second adjustment rod is configured to switch between a rotatable connection and a fixed connection.

In an exemplary embodiment of the present disclosure, the second end of at least one of the first adjustment rod and the second adjustment rod is fixedly connected to a side of the flexible adsorption plate.

In an exemplary embodiment of the present disclosure, the rotating component further includes a power device, and the power device is configured to drive the rotating shaft to rotate.

In an exemplary embodiment of the present disclosure, the attaching device further includes a heater for heating the flexible adsorption plate.

In an exemplary embodiment of the present disclosure, the attaching device further includes a temperature sensor and a processor. The temperature sensor is positioned on the flexible adsorption plate and is configured to detect the temperature of the flexible adsorption plate. The processor is connected to the temperature sensor and the heater, and is configured to control the heating power of the heater based on the temperature detected by the temperature sensor.

In an exemplary embodiment of the present disclosure, the heater includes heating wires, and the heating wires are evenly distributed on the flexible adsorption plate.

In an exemplary embodiment of the present disclosure, the attaching device further includes an adsorption platform, wherein the adsorption platform is located at a side of the flexible adsorption plate having an adsorption surface, and the adsorption surface of the adsorption platform faces the flexible adsorption plate.

In an exemplary embodiment of the present disclosure, a plurality of negative pressure holes is provided in the adsorption surface of the flexible adsorption plate and/or the adsorption platform.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Understandably, the drawings in the following description are only some embodiments of the present disclosure. For those of ordinary skills in the art, other drawings can be obtained based on these drawings without creative work.

DETAILED DESCRIPTION OF THE EMBODIMENTS

Figure 1:
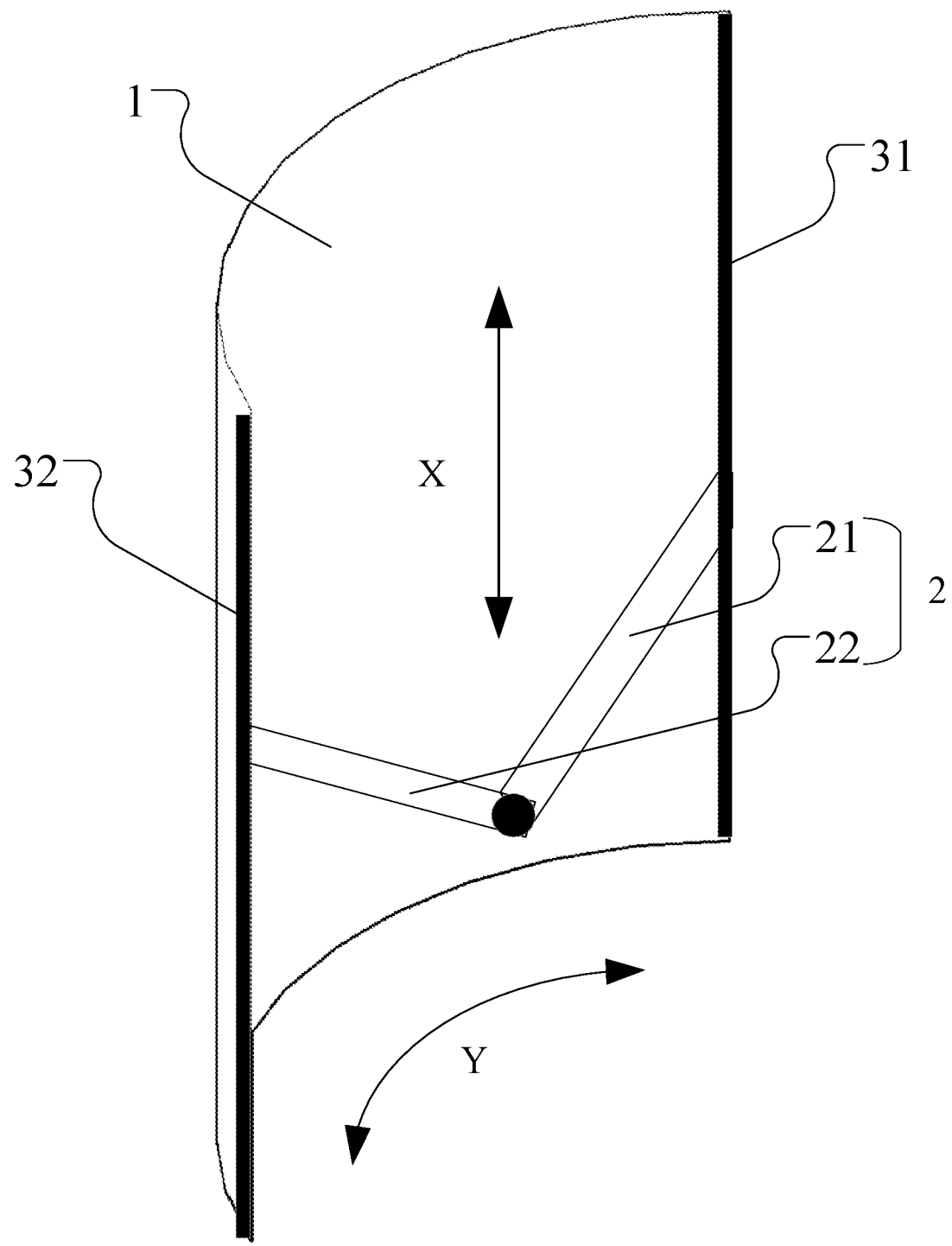
FIG. 1 is a schematic structural diagram of an attaching device for a flexible display panel according to an embodiment of the present disclosure.

Example embodiments will now be described more fully with reference to the accompanying drawings. However, the example embodiments can be implemented in various forms, and should not be construed as being limited to the examples set forth herein. On the contrary, the provision of these embodiments makes the present disclosure more comprehensive and complete, and fully conveys the concept of the example embodiments to those skilled in the art. The same reference numerals in the figures indicate the same or similar structures, and thus their detailed descriptions will be omitted.

Although relative terms such as "above" and "below" are used in the specification to describe the relative relationship between one component and another component, these terms are used in the specification only for convenience. For example, these terms are used based on the relative relationship shown in the drawings. It can be understood that if a device in the figures is turned over and for example turned upside down, a component described as being "above" the device will become "below" the device. Other relative terms, such as "high", "low", "top", "bottom", "left" and "right" have similar meanings. When a first structure is "on" a second structure, it means that the first structure is integrally formed on the second structure, or that the first structure is "directly" installed on the second structure, or that the first structure is "indirectly" installed on the second structure through a third structure.

The terms "a", "an", and "the" are used to indicate the existence of one or more elements or components etc. The terms "include" and "have" are used to mean open-ended inclusion, and mean that in addition to the listed elements or compositions, etc., there may be other elements or compositions, etc.

Figure 2:
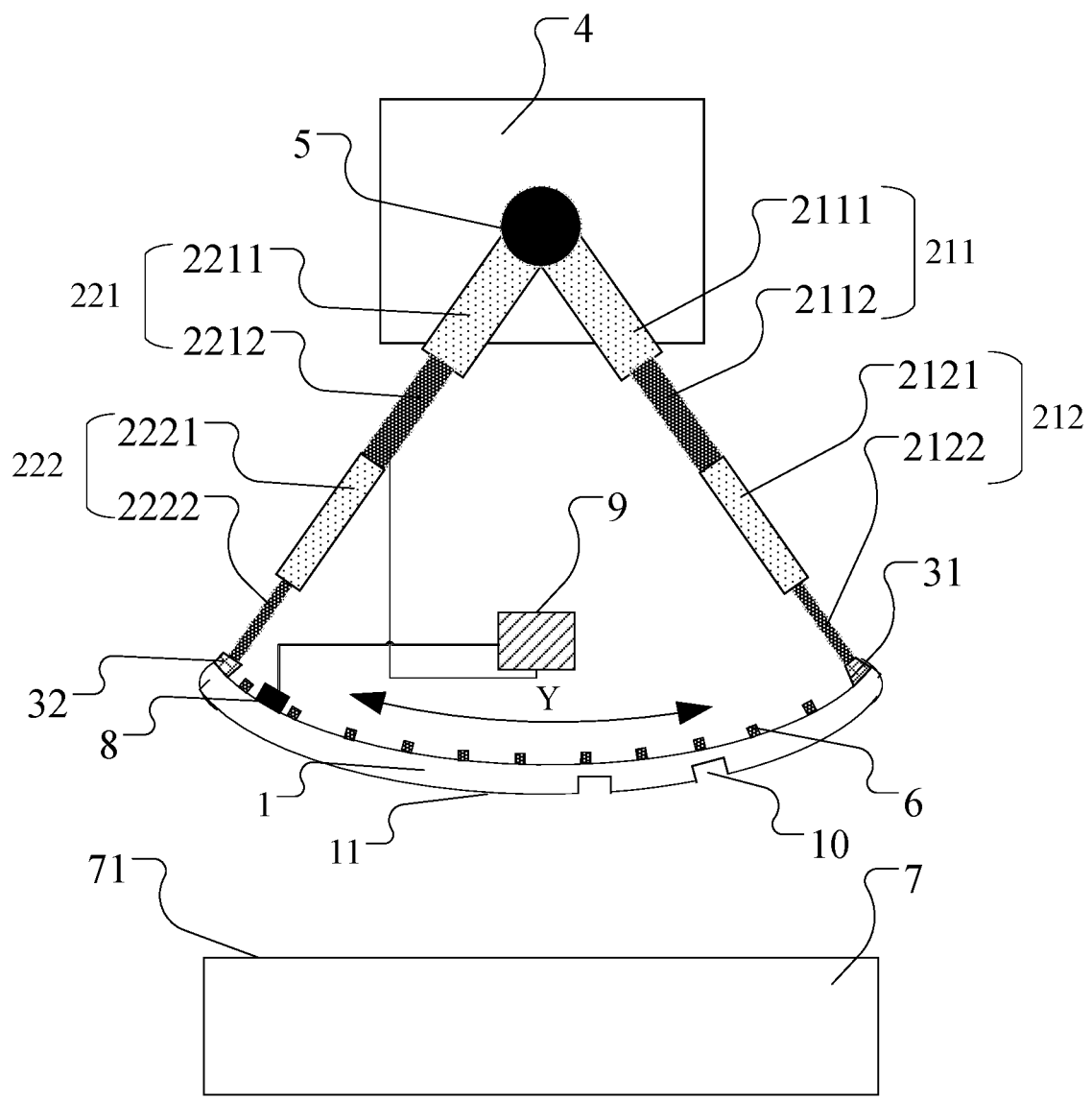
FIG. 2 is a side view of an attaching device for a flexible display panel according to an exemplary embodiment of the present disclosure.

An exemplary embodiment provides an attaching device for a flexible display panel, as shown in FIGS. 1 and 2. FIG. 1 is a schematic structural diagram of an attaching device for a flexible display panel according to an exemplary embodiment of the present disclosure, and FIG. 2 is a side view of an attaching device for a flexible display panel according to an exemplary embodiment of the present disclosure. The attaching device for a flexible display panel includes a flexible adsorption plate 1 and an adjustment assembly 2. The flexible adsorption plate 1 can be bent along the bending axis X. The adjustment assembly 2 is configured to adjust the degree of bending of the flexible adsorption plate 1 along the bending axis X.

The flexible adsorption plate 1 has uniform bending characteristics. That is, when the flexible adsorption plate 1 is bent along the bending axis X, the curved side can be bent into an arc shape. As shown in FIG. 2, the flexible adsorption plate 1 may include an adsorption surface 11, and a plurality of negative pressure holes 10 may be provided in the adsorption surface 11. The negative pressure holes 10 can be used to adsorb flexible layers such as the flexible array substrate, the support layer, the optical adhesive layer, the base film, and the cover plate in the flexible display panel, helping to attach each flexible layer in the flexible display panel in a bent state. With the attaching device for a flexible display panel as provided by an exemplary embodiment, the degree of bending of the flexible adsorption plate 1 along the bending axis X can be adjusted by the adjustment assembly 2. Thus, it is allowed that the various flexible layers can be attached in different bent states (including the flat state). It should be noted that, although two negative pressure holes 10 formed on the adsorption surface 11 of the flexible adsorption plate 1 are shown as an example in FIG. 2, this does not represent any limitation to the present disclosure. According to the teachings of the present disclosure, those skilled in the art shall understand that the negative pressure holes can be also formed on the adsorption surface of a corresponding adsorption platform, and that the negative pressure holes can be formed in suitable numbers, positions, shapes, and the like.

In an exemplary embodiment, as shown in FIG. 1, the adjustment assembly 2 includes a first adjustment rod 21 and a second adjustment rod 22. The first adjustment rod 21 can be retractable, and the first adjustment rod 21 includes a first end and a second end. Similarly, the second adjustment rod 22 can be retractable as well, and the second adjustment rod 22 includes a first end and a second end as well. The first end of the first adjustment rod 21 can be fixedly connected to the first end of the second adjustment rod 22. The second end of the first adjustment rod 21 and the second end of the second adjustment rod 22 can be connected to opposite sides of the flexible adsorption plate 1, respectively. The second end of the first adjustment rod 21 and the second end of the second adjustment rod 22 may be connected to opposite sides of the flexible adsorption plate 1, respectively. Alternatively, the second end of the first adjustment rod 21 and the second end of the second adjustment rod 22 may be connected at positions close to the opposite sides of the flexible adsorption plate 1, respectively. The second end of the first adjustment rod 21 and the second end of the second adjustment rod 22 may be fixedly connected to opposite sides of the flexible adsorption plate 1 respectively by means of bonding or the like. The opposite sides are located at opposite ends of the flexible adsorption plate 1 along the first extension direction Y, where the first extension direction Y is perpendicular to the bending axis X. In addition, the second end of the first adjustment rod 21 and the second end of the second adjustment rod 22 may also be slidably connected to opposite sides of the flexible adsorption plate 1. For example, the second end of the first adjustment rod 21 and the second end of the second adjustment rod 22 can be slidably connected to opposite sides of the flexible adsorption plate 1 along the first extension direction Y. At the same time, the first ends of the first adjustment rod 21 and the second adjustment rod 22 can also be rotated relatively to each other in a direction perpendicular to the bending axis X. Thus, the angle between the first adjustment rod 21 and the second adjustment rod 22 can be adjusted. The connection between the first ends of the first adjustment rod 21 and the second adjustment rod 22 can be switched between a fixed connection and a rotatable connection. The plane where the first adjustment rod 21 and the second adjustment rod 22 are located may be perpendicular to the bending axis X.

In an exemplary embodiment, the adjustment assembly 2 can adjust the degree of bending of the flexible adsorption plate 1 along the bending axis X by changing the expansion and contraction amounts of the first adjustment rod 21 and the second adjustment rod 22. As shown in FIG. 1, the first ends of the first adjustment rod 21 and the second adjustment rod 22 are fixedly connected. When the extension of the first adjustment rod 21 and the second adjustment rod 22 increases, the degree of bending of the flexible adsorption plate 1 along the bending axis X decreases. Correspondingly, when the shrinkage of the first adjustment rod 21 and the second adjustment rod 22 increases, the degree of bending of the flexible adjustment plate 1 along the bending axis X increases. The first adjustment rod 21 and the second adjustment rod 22 can be telescopic cylinders, for example, electric telescopic cylinders, pneumatic telescopic cylinders, hydraulic telescopic cylinders, and the like.

It should be understood that in other exemplary embodiments, only one of the first adjustment rod 21 and the second adjustment rod 22 can be retractable. Similarly, by adjusting expansion and contraction of one adjustment rod, the flexible adsorption plate 1 can also be adjusted in the degree of bending.

In an exemplary embodiment, as shown in FIGS. 1 and 2, the opposite sides include a first side and a second side. The attaching device for a flexible display panel can further include a first rigid support 31 and a second rigid support 32. The first rigid support 31 extends along an edge at the first side of the flexible adsorption plate 1, and is fixedly connected to the first side of the flexible adsorption plate 1 at multiple positions in the extension direction of the first rigid support 31. The second rigid support 32 extends along an edge at the second side of the flexible adsorption plate 1, and is fixedly connected to the second side of the flexible adsorption plate at multiple positions in the extension direction of the second rigid support 32. The second end of the first adjustment rod 21 can be connected to the first rigid support 31 by a fixed connection. The second end of the second adjustment rod 22 and the second rigid support 32 are fixedly connected. The first rigid support 31 and the second rigid support 32 have rigidity, so that they are not prone to bending. The first rigid support 31 can drive the entire first side of the flexible adsorption plate 1 to bend, and the second rigid support 32 can drive the entire second side of the flexible adsorption plate 1 to bend. This kind of arrangement ensures that the first side and the second side of the flexible adsorption plate 1 have the same degree of bending at different positions. For example, the upper part and the lower part of the flexible adsorption plate 1 in FIG. 1 have the same degree of bending.

In an exemplary embodiment, as shown in FIG. 2, the first adjustment rod can include a first telescopic cylinder 211 and a second telescopic cylinder 212. The cylinder end 2111 of the first telescopic cylinder 211 forms the first end of the first adjustment rod. The cylinder end 2121 of the second telescopic cylinder 212 is connected to the piston end 2112 of the first telescopic cylinder 211, and the piston end 2122 of the second telescopic cylinder 212 forms the second end of the first adjustment rod. The adjustment accuracy of the first telescopic cylinder may be less than the adjustment accuracy of the second telescopic cylinder, or the adjustment accuracy of the second telescopic cylinder may be less than the adjustment accuracy of the first telescopic cylinder. The second adjustment rod can include a third telescopic cylinder 221 and a fourth telescopic cylinder 222. The cylinder end 2211 of the third telescopic cylinder 221 forms the first end of the second adjustment rod. The cylinder end 2221 of the fourth telescopic cylinder 222 is connected to the piston end 2212 of the third telescopic cylinder 221. The piston end 2222 of the fourth telescopic cylinder 222 forms the second end of the second adjustment rod. The adjustment accuracy of the third telescopic cylinder may be less than the adjustment accuracy of the fourth telescopic cylinder, or the adjustment accuracy of the fourth telescopic cylinder may be less than the adjustment accuracy of the third telescopic cylinder. The telescopic cylinders as mentioned above may be an electric telescopic cylinder, a pneumatic telescopic cylinder, a hydraulic telescopic cylinder, and the like. Both the first adjustment rod and the second adjustment rod are configured to be composed of two telescopic cylinders with different adjustment accuracies, so that the adjustment accuracy can be improved without compromising the adjustment speed. For example, when adjusting the amount of expansion and contraction in a large range, a telescopic cylinder with smaller adjustment accuracy can be used, and when adjusting the amount of expansion and contraction in a small range, a telescopic cylinder with greater adjustment accuracy can be used. It should be understood that the first adjustment rod and the second adjustment rod may also have other structures. For example, the first adjustment rod and the second adjustment rod may be composed of other numbers of telescopic cylinders in series. The first and second adjustment rods can also be formed by a single telescopic cylinder.

In an exemplary embodiment, as shown in FIG. 2, the attaching device for a flexible display panel may further include a rotating component, and the rotating component may include a fixing member 4 and a rotating shaft 5. The rotating shaft 5 can be rotatably connected to the fixing member 4 along its axial direction. The first end of the first adjustment rod and the first end of the second adjustment rod can be fixedly connected to the rotating shaft 5 at the same time. The axial direction of the rotating shaft 5 may be parallel to the bending axis of the flexible adsorption plate 1, so that the flexible adsorption plate 1 can rotate relative to the fixing member 4 in a direction perpendicular to the bending axis. The rotating component may further include a power device, and the power device may be configured to drive the rotating shaft to rotate.

In an exemplary embodiment, as shown in FIG. 2, the attaching device for a flexible display panel may further include a heater 6, and the heater 6 may be configured to heat the flexible adsorption plate 1. Different flexible layers in the flexible display panel have different optimal attachment temperatures. The heater 6 can control the temperature of the flexible adsorption plate 1, so that the flexible layers adsorbed by the flexible adsorption plate 1 are at the optimal attachment temperature.

In an exemplary embodiment, the attaching device for a flexible display panel may further include a temperature sensor 8 and a processor 9. The temperature sensor 8 can be disposed on the flexible adsorption plate 1 for detecting the temperature of the flexible adsorption plate 1. The processor 9 is connected to the temperature sensor 8 and the heater 6, and is configured to control the heating power of the heater 6 according to the temperature detected by the temperature sensor 8. The temperature sensor, the processor, and the heater can adjust the temperature of the flexible adsorption plate 1 to any desired temperature. The heater can include heating wires, and the heating wires can be evenly distributed on the flexible adsorption plate 1. Herein, it should be noted that although a specific arrangement of the temperature sensor 8 and the processor 9 is shown as an example in FIG. 2, this does not represent any limitation to the present disclosure, and positions of the temperature sensor 8 and the processor 9 can be changed according to the actual situation.

In an exemplary embodiment, as shown in FIG. 2, the attaching device for a flexible display panel may further include an adsorption platform 7, and the adsorption platform 7 may be located at a side of the flexible adsorption plate 1 having an adsorption surface 11. The adsorption surface 71 of the adsorption platform 7 faces the flexible adsorption plate 1. When the attaching device is used to attach a flexible display panel, the adsorption surface 11 of the flexible adsorption plate 1 can be used firstly to adsorb the first flexible layer, and the adsorption surface 71 of the adsorption platform 7 can be used to adsorb the second flexible layer. Then, the fixing member 4 is moved so that the adsorption surface 11 of the flexible adsorption plate 1 is close to the adsorption surface 71 of the adsorption platform 7. Then, as shown in FIG. 2, the adsorption platform 7 is moved left and right in the horizontal direction and the flexible adsorption plate 1 is rotated at the same time, so that the first flexible layer and the second flexible layer are attached to each other.

Those skilled in the art shall straightforwardly think of other embodiments of the present disclosure after considering the specification and practicing the content disclosed herein. The present application is intended to cover any variations, uses, or adaptive changes of the present disclosure. These variations, uses, or adaptive changes follow the generality of the present disclosure, and include common knowledge or conventional technical means in the technical field not disclosed in the present disclosure. The description and the embodiments are only regarded as exemplary, and the true scope and spirit of the present disclosure are limited by the claims.

It should be understood that the present disclosure is not limited to the precise structure that has been described above and shown in the drawings, and that various modifications and changes can be made without departing from the scope of the present disclosure, which is limited only by the appended claims.

The invention claimed is:

1. An attaching device for a flexible display panel, comprising:
    a flexible adsorption plate;
    a first adjustment rod; and
    a second adjustment rod, wherein
    the flexible adsorption plate is configured to be bendable and to adsorb a flexible layer of the flexible display panel;
    a first end of the first adjustment rod is connected to a first end of the second adjustment rod, a second end of the first adjustment rod is connected to a first side edge of the flexible adsorption plate, and a second end of the second adjustment rod is connected to a second side edge of the flexible adsorption plate, wherein the second side edge is opposite to the first side edge;
    the second end of at least one of the first adjustment rod or the second adjustment rod is configured to be movable relative to the first end thereof, for adjusting a degree of bending of the flexible layer;
    a heater configured to heat the flexible adsorption plate;
    a temperature sensor, disposed on the flexible adsorption plate and configured to detect a temperature of the flexible adsorption plate; and
    a processor, connected to the temperature sensor and the heater, and configured to control a heating power of the heater based on the temperature detected by the temperature sensor.

2. The attaching device according to claim 1, wherein the first end of the first adjustment rod is fixedly connected to the first end of the second adjustment rod, and at least one of the first adjustment rod and the second adjustment rod is configured to be retractable.

3. The attaching device according to claim 2, further comprising:
    a first rigid support, extending along an edge at the first side edge of the flexible adsorption plate, and fixedly connected to the first side edge of the flexible adsorption plate at a plurality of positions in an extension direction of the first rigid support; and
    a second rigid support, extending along an edge at the second side edge of the flexible adsorption plate, and fixedly connected to the second side edge of the flexible adsorption plate at a plurality of positions in an extension direction of the second rigid support, wherein
    the second end of the first adjustment rod is fixedly connected to the first rigid support, and
    the second end of the second adjustment rod is fixedly connected to the second rigid support.

4. The attaching device according to claim 2, wherein the first adjustment rod comprises:

a first telescopic cylinder, a cylinder end of the first telescopic cylinder forming the first end of the first adjustment rod; and a second telescopic cylinder, a cylinder end of the second telescopic cylinder being connected to a piston end of the first telescopic cylinder, and a piston end of the second telescopic cylinder forming the second end of the first adjustment rod, wherein an adjustment accuracy of the first telescopic cylinder is less than an adjustment accuracy of the second telescopic cylinder, or the adjustment accuracy of the second telescopic cylinder is less than the adjustment accuracy of the first telescopic cylinder.

5. The attaching device according to claim 4, wherein the second adjustment rod comprises:

a third telescopic cylinder, a cylinder end of the third telescopic cylinder forming the first end of the second adjustment rod; and a fourth telescopic cylinder, a cylinder end of the fourth telescopic cylinder being connected to a piston end of the third telescopic cylinder, and a piston end of the fourth telescopic cylinder forming the second end of the second adjustment rod, wherein an adjustment accuracy of the third telescopic cylinder is less than an adjustment accuracy of the fourth telescopic cylinder, or the adjustment accuracy of the fourth telescopic cylinder is less than the adjustment accuracy of the third telescopic cylinder.

6. The attaching device according to claim 2, further comprising a rotating component, wherein the rotating component comprises:

a fixing member; and a rotating shaft, rotatably connected to the fixing member along an axial direction of the rotating shaft, wherein the first end of the first adjustment rod and the first end of the second adjustment rod are fixedly connected to the rotating shaft, and the axial direction of the rotating shaft is parallel to the flexible adsorption plate.

7. The attaching device according to claim 2, wherein the second end of at least one of the first adjustment rod and the second adjustment rod is fixedly connected to a side edge of the flexible adsorption plate.

8. The attaching device according to claim 1, wherein the first end of the first adjustment rod is rotatably connected to the first end of the second adjustment rod, and the second end of at least one of the first adjustment rod or the second end of or the second adjustment rod is configured to be rotatable about the first end thereof, for adjusting an angle between the first adjustment rod and the second adjustment rod.

9. The attaching device according to claim 8, wherein the second end of at least one of the first adjustment rod and the second adjustment rod is slidably connected to the first side edge or the second side edge of the flexible adsorption plate.

10. The attaching device according to claim 8, wherein a connection between the first end of the first adjustment rod and the first end of the second adjustment rod is configured to switch between a rotatable connection and a fixed connection.

11. The attaching device according to claim 1, wherein the heater comprises heating wires evenly distributed on the flexible adsorption plate.

12. The attaching device according to claim 1, further comprising:

an adsorption platform, disposed at a side of the flexible adsorption plate having an adsorption surface, wherein the adsorption platform has an adsorption surface facing the flexible adsorption plate.

13. The attaching device according to claim 12, wherein a plurality of negative pressure holes are provided in the adsorption surface of at least one of the flexible adsorption plate and the adsorption platform.

\* \* \* \* \*